United States Patent
Wang et al.

(10) Patent No.: US 8,456,843 B2
(45) Date of Patent: Jun. 4, 2013

(54) SERVER RACK WITH BAFFLES

(75) Inventors: Wen-Chen Wang, New Taipei (TW); Chieh-Hsiang Lin, New Taipei (TW); Hung-Ting Su, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 362 days.

(21) Appl. No.: 13/006,440

(22) Filed: Jan. 14, 2011

(65) Prior Publication Data

US 2012/0132598 A1     May 31, 2012

(30) Foreign Application Priority Data

Nov. 26, 2010   (TW) .................................. 99140881

(51) Int. Cl.
*H05K 5/03*       (2006.01)
*E05D 15/56*      (2006.01)

(52) U.S. Cl.
USPC ........................... 361/724; 312/223.1; 49/246

(58) Field of Classification Search
USPC ............ 361/724, 807, 825; 312/223.1, 223.2, 312/319.1, 319.2, 326, 329; 49/246, 152, 49/163, 192, 98, 371, 397
See application file for complete search history.

(56) References Cited

U.S. PATENT DOCUMENTS

| | | | |
|---|---|---|---|
| 4,579,053 A * | 4/1986 | Beesley et al. .................. | 49/371 |
| 2010/0313482 A1* | 12/2010 | Minegishi et al. .............. | 49/386 |
| 2011/0053485 A1* | 3/2011 | Huang et al. ................... | 454/184 |
| 2011/0203179 A1* | 8/2011 | Boens ............................. | 49/142 |
| 2012/0285096 A1* | 11/2012 | Green ............................. | 49/366 |

* cited by examiner

Primary Examiner — Michael Safavi
(74) Attorney, Agent, or Firm — Altis Law Group, Inc.

(57) ABSTRACT

A server rack includes a bracket, a first baffle, a first elastic member, a second baffle, and a second elastic member. The bracket includes a first side plate and a second side plate and defines a receiving space. The receiving space has an entry. An end of the first baffle is pivotally connected to the first side plate close to the entry. The first elastic member is connected to the first side plate and the first baffle and capable of elastically driving the first baffle to move from a first position to a second position. An end of the second baffle is pivotally connected to another end of the first baffle away from the first side plate. A second elastic member is connected to the first baffle and the second baffle and capable of elastically driving the second baffle to move from a third position to a fourth position.

16 Claims, 4 Drawing Sheets

SERVER RACK WITH BAFFLES

BACKGROUND

1. Technical Field

The present disclosure relates to server racks and, particularly, to a server rack with baffles.

2. Description of Related Art

Server racks often include a main body and a number of flat baffles. The main body defines a number of spaces for receiving a number of modules. A distal end of the flat baffle is pivotally connected to a sidewall of the corresponding space by a torsion spring, close to an entry of the corresponding space. When a module is received in the space, the flat baffle is pushed close to rotate until abutting the sidewall of the space. When the module is taken out from the space, the torsion spring drives the flat baffle to restore, covering the entry of the respective space again. When pushing the module into the space through the entry, a plate of the module that faces the entry is usually positioned substantially parallel to the flat baffle. Further, the plate clings to the flat baffle to push the flat baffle to rotate as the module moves on. However, as the plate clings to the flat baffle at first, relatively large force is required to drive the plat baffle to rotate, inconveniencing operation.

Therefore, it is desirable to provide a new server rack, which can overcome the described limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will now be described in detail with reference to the drawings.

Figure 1:
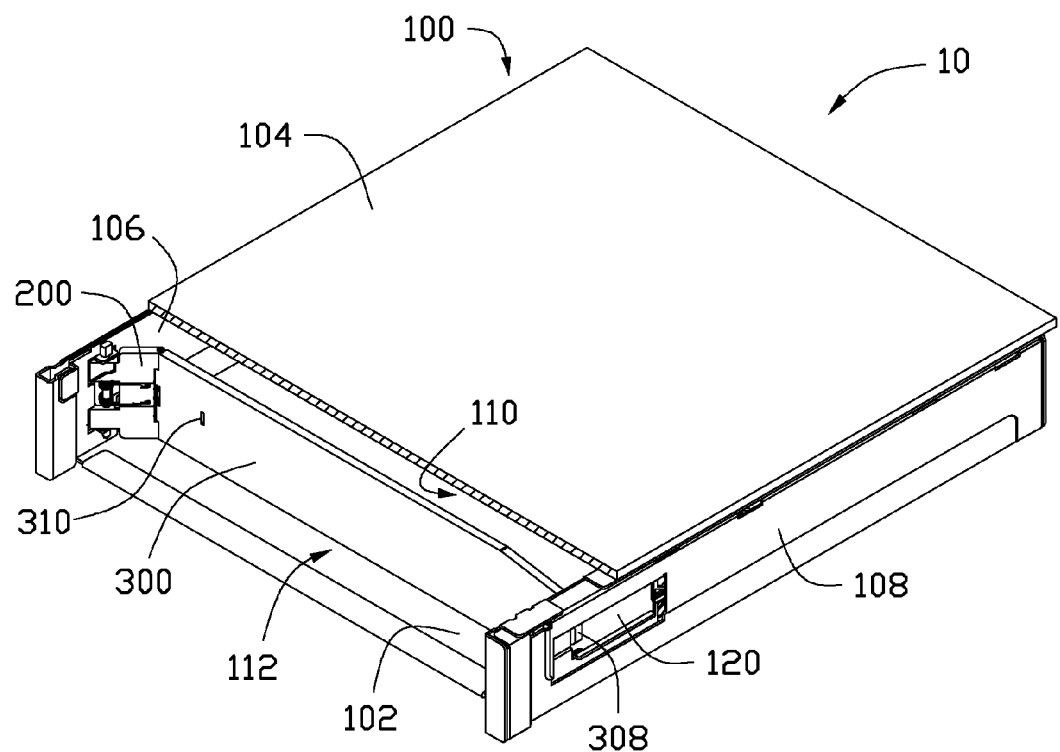
FIG. 1 is an isometric view of a server rack, in accordance with an exemplary embodiment.
Figure 2:
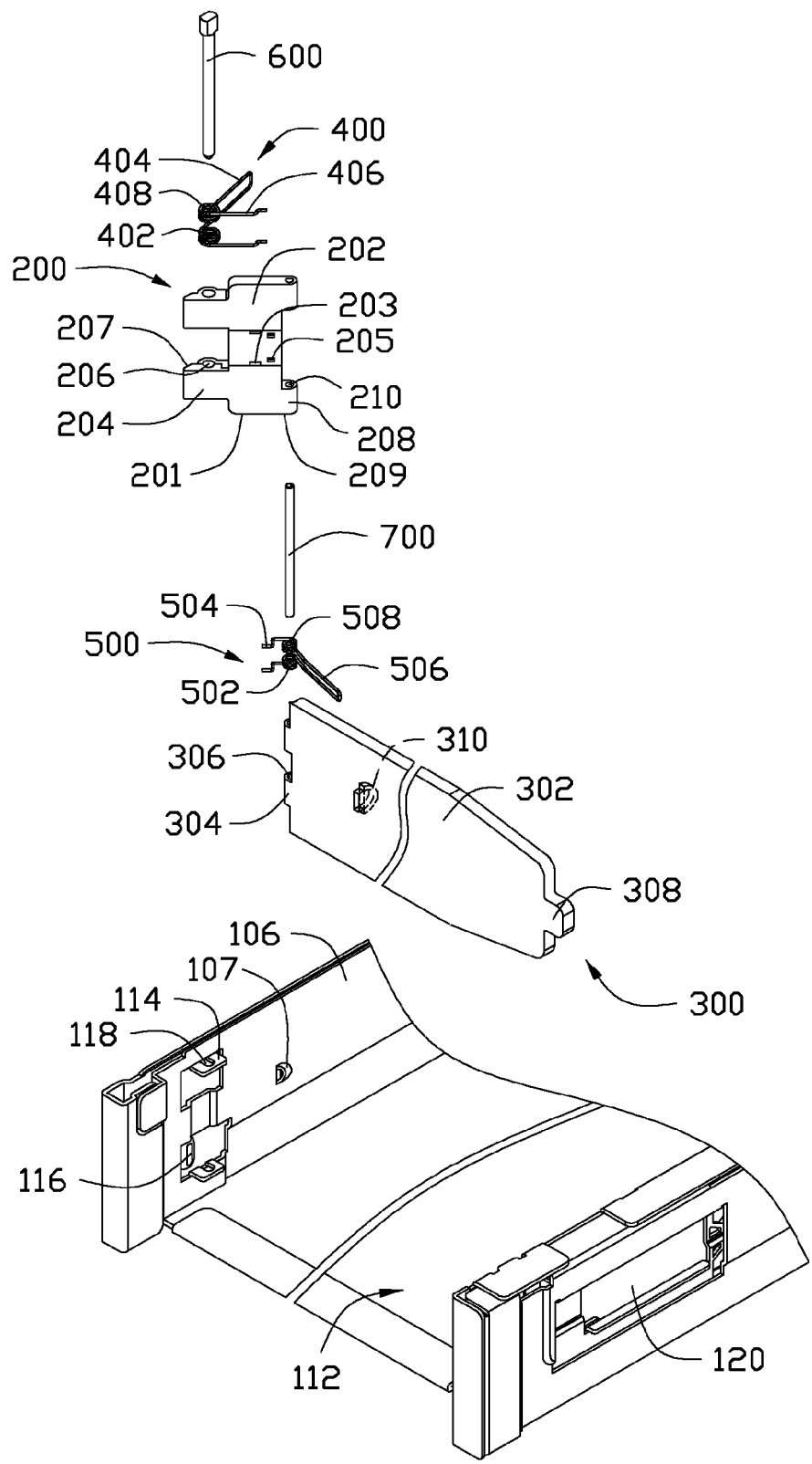
FIG. 2 is an exploded view of the server rack of FIG. 1.

Referring to FIGS. 1 and 2, a server rack 10, according to an exemplary embodiment, includes a bracket 100, a first baffle 200, a second baffle 300, a first elastic member 400, a second elastic member 500, a first shaft 600, and a second shaft 700.

Figure 3:
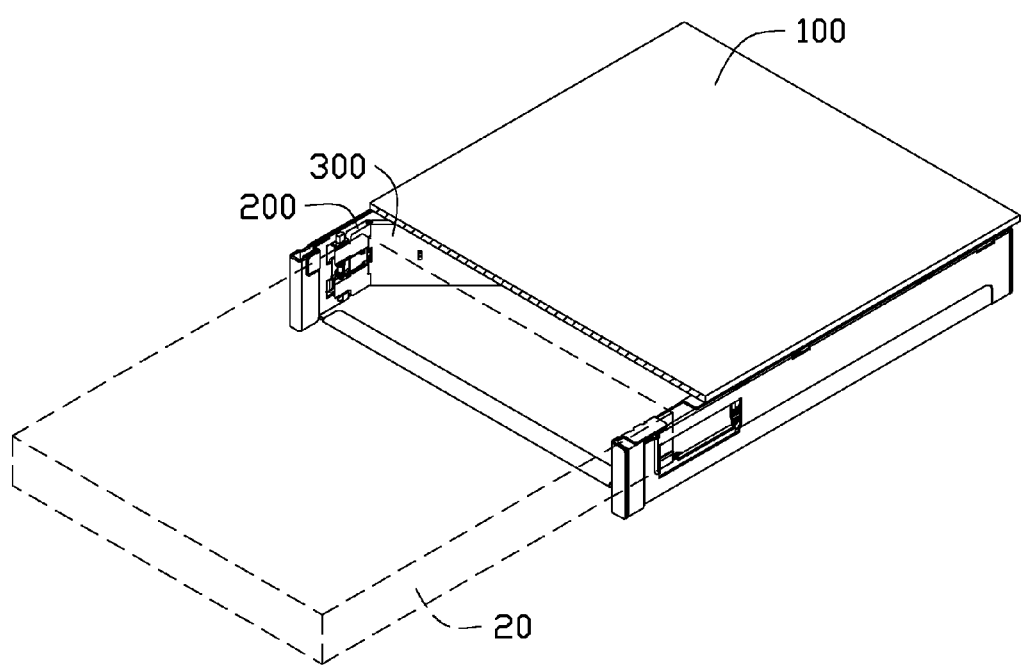
FIG. 3 is an assembled view of a module and the server rack of FIG. 1.
Figure 4:
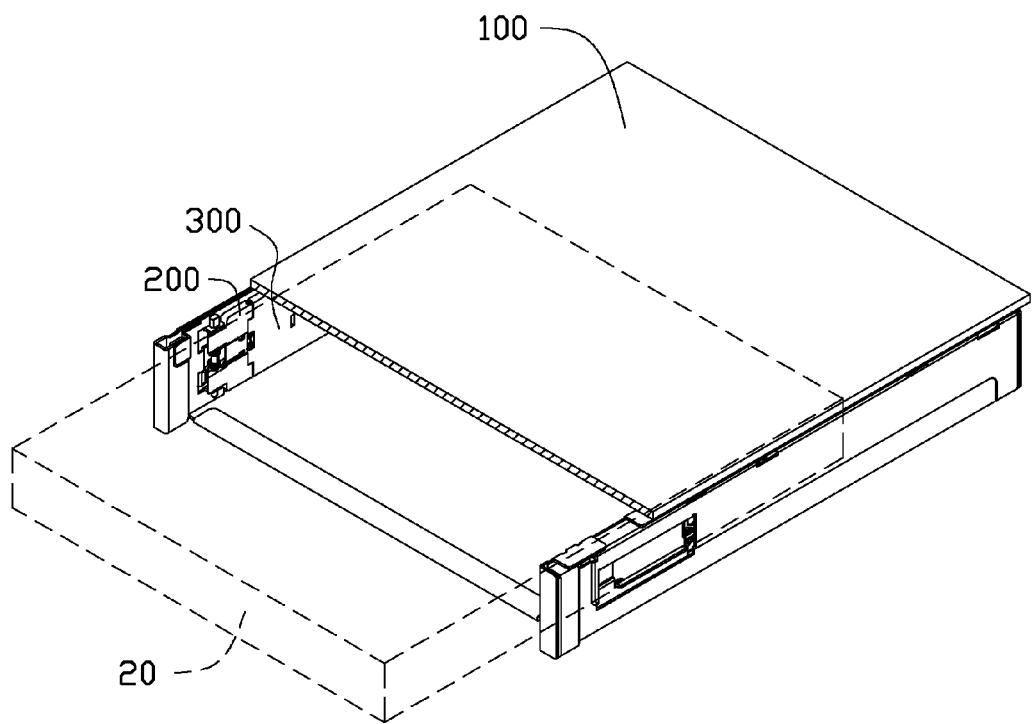
FIG. 4 is another assembled view of the module and the server rack of FIG. 1.

The bracket 100 includes a bottom plate 102, a first side plate 106 and a second side plate 108 respectively extending upward from two opposite sides of the bottom plate 102, and a top plate 104 connected to the first side plate 106 and the second side plate 108, facing the top plate 102. The bracket 100 defines a receiving space 110 surrounded by the bottom plate 102, the top plate 104, the first side plate 106, and the second side plate 108 for receiving a module 20 (shown in FIG. 3). The receiving space 110 defines an entry 112 through which the module 20 enters the receiving space 110. In the present embodiment, the bottom plate 102, the first side plate 106, and the second side plate 108 are integrally formed. The top plate 104 is connected to the first side plate 106 and the second side plate 108 by fasteners, enabling removal thereof.

The first side plate 106 forms two fixing plates 114, a block 116, and a first through hole 107 close to the entry 112. Each of the two fixing plates 114 defines a connecting hole 118 therethrough. The two fixing plates 114 are separated, with a first connection line of the two connecting holes 118 substantially perpendicular to the bottom plate 102. The block 116 and the first through hole 107 are arranged at two sides of the first connection line of the two connecting holes 118 and the block 116 is closer to the entry 112. The second side plate 108 defines a resisting hole 120 near the entry 112.

The first baffle 200 includes a substantially rectangular first body 202. The first body 202 includes a first connection end 201 and a second connection end 209 opposing the first connection end 201. The first connection end 201 forms two first protrusions 204 that extend outward from the first connection end 201. Each of the two first protrusions 204 defines a first assembly hole 206. A second connection line of the two first assembly holes 206 is substantially perpendicular to the bottom plate 102. An end 207 of each first protrusion 204 that is away from the first body 202 is wedge-shaped. The second connection end 209 forms two second protrusions 208 that extend outward from the second connection end 209. Each of the two second protrusions 208 defines a second assembly hole 210. A third connection line of the two second assembly holes 210 is substantially perpendicular to the bottom plate 102. The first body 202 forms two second through holes 203 close to the first protrusion 204 and two third through holes 205 close to the second protrusion 208.

The first elastic member 400 is substantially V-shaped and includes two first flexible bodies 402, a first end 404, and two second ends 406. Each first flexible body 402 defines a first receiving hole 408. The first end 404 is connected to the two first flexible bodies 402. The two second ends 406 are connected to the two first flexible bodies 402 correspondingly. In the present embodiment, the first elastic member 400 is a torsion spring.

The second baffle 300 includes a substantially rectangular second body 302. The second body 302 forms two third protrusions 304 that extend outward from a third connection end thereof and a resisting protrusion 308 that extends outward from an opposite fourth connection thereof. Each of the two third protrusions 304 defines a third assembly hole 306. A fourth connection line of the two third assembly holes 306 is substantially perpendicular to the bottom plate 102. The second body 302 also defines a fourth through hole 310 close to the third protrusions 304.

The second elastic member 500 is substantially V-shaped and includes two second flexible bodies 502, a third end 506, and two fourth ends 504. Each second flexible body 502 defines a second receiving hole 508. The third end 506 is connected to the two second flexible bodies 502. The two fourth ends 504 are connected to the two second flexible bodies 502 correspondingly. In the present embodiment, the second elastic member 500 is a torsion spring.

During assembling, the first shaft 600 passes through the connecting holes 118, the first assembly holes 206, and the first receiving holes 408. The first end 404 of the first elastic member 400 passes through the first through hole 107 of the first side plate 106. The second ends 406 of the first elastic member 400 pass through the second through holes 203 of the first baffle 200 correspondingly. The second shaft 700 passes through the second assembly holes 210, the third assembly holes 306, and the second receiving holes 508. The fourth ends 504 of the second elastic member 500 pass through the third through holes 205 correspondingly. The second end 506 of the second elastic member 500 passes through the fourth through hole 310.

As such, a distal end of the first baffle 200 is pivotally connected to an end of the first side plate 106 close to the entry 112. A distal end of the second baffle 300 is pivotally connected to an end of the first baffle 200 away from the first side plate 106. The first elastic member 400 is connected to the first side plate 106 and the first baffle 200, thereby elastically driving the first baffle 200 from a first position to a second position. At the first position, an acute angle is formed between the first baffle 200 and the first side plate 106. At the second position, the first baffle 200 contacts the first side plate 106. The second elastic member 500 is connected to the first baffle 200 and the second baffle 300, thereby elastically driving the second baffle 300 from a third position to a fourth position. At the third position, an obtuse angle is formed between the first baffle 200 and the second baffle 300. At the fourth position, the first baffle 200 and the second baffle 300 form an angle of about 180°.

In the present embodiment, at the first position, an angle of about 45° is included between the first baffle 200 and the first side plate 106. Meanwhile, the wedge-shaped end 207 of the first baffle 200 resists the block 116 and the first elastic member 400 is in a relaxed state. At the second position, the elastic member 400 is distorted and the first baffle 200 contacts the first side plate 106 (shown in FIG. 3). At the third position, an angle of about 135° is included between the first baffle 200 and the second baffle 300. At the same time, an inner surface of the resisting hole 120 close to the entry 112 contacts the resisting protrusion 308 and the second elastic member 500 is at a relaxed state. At the fourth position, the second elastic member 500 is distorted and the first baffle 200 and the second baffle 300 form an angle of 180°.

In operation, when one module 20 is received in the receiving space 110, the first baffle 200 is at the first position, the second baffle 500 is at the third position (shown in FIG. 1). When the module 20 is entering the receiving space 110, a plate (not shown) of the module 20 that faces the entry 112 and the first baffle 200 form an angle of about 45°, whereby only minimal effort is required to rotate the first baffle 200 to about the first shaft 600. As the module 20 moves on, the first baffle 200 rotates to the second position, and the second baffle 500 is still at the third position (shown in FIG. 3). In this case, the plate of the module 20 and the second baffle 500 form an angle of about 45°. With continued entry of the module 20, the second baffle 500 rotates to the fourth position. When the module 20 has been withdrawn, under the torque of the first elastic member 400 and the second elastic member 500, the second baffle 300 and the first baffle 200 rotate towards the entry 112. The first baffle 200 stays at the first position under the block of the end 207 and the block 116. The second baffle 300 stays at the third position under the block of the resisting protrusion 308 and the resisting hole 120.

In alternative embodiments, under the torque of the first elastic member 400 and the second elastic member 500, the first baffle 200 can remain in the first position and the second baffle 300 can also remain in the third position. Therefore, it should be understood that the block 116, the resisting protrusion 308, and the resisting hole 120 can be omitted.

In alternative embodiments, the first and second elastic member 400 and 500 can be other elastic members, such as a V-shaped memory alloy, as long as the first baffle 200 can be rotated from the first position to the second position and the second baffle 500 can be rotated from the third position to the fourth position.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A server rack with baffles, comprising:
   a bracket that comprises a first side plate and a second side plate opposing the first side plate, the first side plate and the second side plate defining a receiving space, the receiving space having an entry;
   a first baffle comprising a first connection end and a connection second end, the first connection end pivotally connected to the first side plate close to the entry;
   a first elastic member connected to the first side plate and the first baffle and capable of elastically driving the first baffle to move between a first position and a second position, wherein at the first position, the first baffle and the first side plate form an acute angle, and at the second position, the first baffle contacts the first side plate;
   a second baffle comprising a third connection end and a fourth connection end, the third connection end pivotally connected to the second connection end of the first baffle away from the first side plate; and
   a second elastic member connected to the first baffle and the second baffle and capable of elastically driving the second baffle to move between a third position and a fourth position, wherein at the third position, the first baffle and the second baffle form an obtuse angle, at the fourth position, the first baffle and the second baffle form an angle of about 180°.

2. The server rack of claim 1, wherein at the first position, the first elastic member is in a relaxed state.

3. The server rack of claim 1, wherein at the third position, the second elastic member is in a relaxed state.

4. The server rack of claim 1, wherein at the first position, an angle of about 45° is included between the first baffle and the first side plate.

5. The server rack of claim 1, wherein at the third position, an angle of about 135° is included between the first baffle and the second baffle.

6. The server rack of claim 1, wherein the bracket further comprises a bottom plate, the first side plate and the second side plate respectively extends upwards from two opposite sides of the bottom plate.

7. The server rack of claim 6, wherein the bracket further comprises a top plate connected to the first side plate and the second side plate, facing the bottom plate.

8. The server rack of claim 7, wherein the bottom plate, the first side plate, and the second side plate are integrally formed with other, and the top plate is detachably connected to the first side plate and the second side plate.

9. The server rack of claim 6, wherein the first side plate forms two fixing plate close to the entry, each of the two fixing plate defines a connecting hole therethrough; the two fixing plate are separated and a first connection line of the two connecting hole is substantially perpendicular to the bottom plate; the first baffle comprises a first body that comprises the first connection end and the connection second end opposing the first connection end, the first connection end forms two first protrusions that extend outward from the first connection end, each of the two first protrusions defines a first assembly hole, a second connection line of the two first assembly holes is substantially perpendicular to the bottom plate; a first shaft passes through the connecting holes and the first assembly holes.

10. The server rack of claim 9, wherein the first elastic member comprises two first flexible bodies, a first end, and two second ends, each first flexible body defines a first receiving hole, the first end is connected to the two first flexible bodies, the two second ends are connected to the two first flexible bodies correspondingly; the first side plate defines a first through hole at a side of the first connection line of the two connecting holes away from the entry; the first body of the first baffle defines two second through holes close to the first protrusions; the first shaft passes through the connecting holes, the first assembly holes, and the first receiving holes, the first end of the first elastic member passes through the first through hole of the first side plate, the second ends of the first elastic member pass through the second through holes of the first baffle correspondingly.

11. The server rack of claim 10, wherein the first elastic member is a torsion spring.

12. The server rack of claim 10, wherein the first side plate comprises a block positioned at a side of the first connection line of the two connecting holes close to the entry; an end of each first protrusion away from the first body is wedge-shaped; at the first position, the wedge-shaped end of each first protrusion of the first baffle resists the block of the first side plate.

13. The server rack of claim 9, wherein the second connection end of the first baffle forms two second protrusions that extend outward from the second connection end, each of the two second protrusions defines a second assembly hole, a third connection line of the two second assembly holes is substantially perpendicular to the bottom plate; the second baffle comprises a substantially rectangular second body that comprises the third connection end and the fourth connection end, the second baffle comprises two third protrusions protruding outward from the third connection end, each of the two third protrusions defines a third assembly hole, a fourth connection line of the two third assembly holes is substantially perpendicular to the bottom plate; a second shaft passes through the second assembly holes and the third assembly holes.

14. The server rack of claim 13, wherein the second elastic member comprises two second flexible bodies, a third end, and two fourth ends, each second flexible body defines a second receiving hole, the third end is connected to the two second flexible bodies, the two fourth ends are connected to the two second flexible bodies correspondingly; the first body of the first baffle defines two third through holes close to the second protrusions; the second body of the second baffle defines a fourth through hole close to the third protrusions; the second shaft passes through the second assembly holes, the third assembly holes, and the second receiving holes, the fourth ends of the second elastic member pass through the third through holes correspondingly, the third end passes through the fourth through hole.

15. The server rack of claim 14, wherein the second elastic member is a torsion spring.

16. The server rack of claim 14, wherein the second baffle comprises a resisting protrusion that extends outward from the fourth connection end, the second side plate defines a resisting hole near the entry; at the third position, an inner surface of the resisting hole close to the entry contacts the resisting protrusion.

\* \* \* \* \*